March 12, 1974 D. F. ALLISON 3,796,612

SEMICONDUCTOR ISOLATION METHOD UTILIZING ANISOTROPIC ETCHING AND DIFFERENTIAL THERMAL OXIDATION

Filed Aug. 5 1971

INVENTOR
DAVID F. ALLISON

BY Flehr, Hohbach, Test, Albritton & Herbert
ATTORNEYS

United States Patent Office 3,796,612

Patented Mar. 12, 1974

3,796,612

SEMICONDUCTOR ISOLATION METHOD UTILIZING ANISOTROPIC ETCHING AND DIFFERENTIAL THERMAL OXIDATION

David F. Allison, Los Altos, Calif., assignor to Scientific Micro Systems, Inc.

Filed Aug. 5, 1971, Ser. No. 169,294
Int. Cl. H01l 7/00, 7/64, 15/00
U.S. Cl. 148—175 6 Claims

ABSTRACT OF THE DISCLOSURE

A semiconductor body in which a plurality of semiconductor devices are formed. Adjacent semiconductor devices are isolated one from the other by isolation moats formed by anisotropic etching of the semiconductor body. The isolation moats are oxidized with oxide growing on the (111) faces of the moats at a faster rate than on the (100) bottoms of the moats. The oxide is then removed with a dilute etch with the etch being applied just long enough to remove the oxide from the bottom of the isolation moats while still leaving some oxide on the sloping sides in the (111) plane. An isolation diffusion is then made at the bottoms of the moats with the oxide on the sides of the moat masking against diffusion through the sides. At the same time the isolation diffusion is made diffusions requiring the same conductivity type for the semiconductor devices are made. Subsequently the semiconductor devices are completed.

BACKGROUND OF THE INVENTION

In the past the density of semiconductor devices in integrated circuits has been limited by the space required for adequate isolation between devices. For example, in conventional NPN bipolar transistor integrated circuits isolation between adjacent P-beds is usually achieved by a P+ diffusion in the N epitaxial layer separating the P-beds with the P+ diffusion extending down into a P-type substrate. The epitaxial N-type layer is usually on the order of three to four microns in thickness. In performing the P+ diffusion, the diffusion must therefore extend downward three of four microns and thus the width of the isolation diffusion is on the order of six or eight microns. Further, since the isolation diffusion extends all the way down through the N-type epitaxial layer it cannot be performed at the same time as the P-bed diffusions which, of course, do not extend all the way through the N-type epitaxial layer. Since these diffusions must be performed separately, alignment problems occur with respect to performing the two separate diffusions and therefore extra space must be left between adjacent P-beds to allow for slight misalignments. In addition, if the isolation diffusion is too close to the P-bed base diffusions, space charge problems are likely to be encountered. In practice, it has been found that in forming NPN bipolar transistors, that a spacing of approximately 23 microns is required between adjacent P-beds. There is, therefore, a need for a semiconductor structure and method which will overcome the above-named limitations.

SUMMARY OF THE INVENTION AND OBJECTS

The semiconductor structure comprises a semiconductor body having a plurality of semiconductor devices formed therein. Adjacent semiconductor devices are separated by isolation moats at the bottom of which is an isolation diffusion. In the method for producing the described semiconductor structure, the isolation moats are formed by anisotropic etching which produces moats having bottom surfaces in the (100) plane and sidewalls in the (111) plane. The sides and bottom of the isolation moats are oxidized at a relatively low temperature to produce a thicker oxide layer on the (111) faces than on the (100) faces. This oxide is then etched to an extent sufficient to remove the oxide from the bottom (100) plane while leaving oxide on the sidewalls or the (111) faces of the isolation moats. A relatively shallow diffusion in the bottom of the isolation moats is then sufficient to isolate adjacent semiconductor devices.

In general, it is an object of the present invention to provide a semiconductor structure and method in which adjacent semiconductor devices in a semiconductor body are separated by isolation moats with isolation diffusions made in the bottom of the moats.

Another object of the invention is to provide a semiconductor structure and method of the above character which readily permits forming semiconductor devices in the semiconductor body which are very closely spaced together but have adequate isolation therebetween.

It is another object of this invention to provide a semiconductor structure and method of the above character in which the isolation diffusion can be performed at the same time as a base diffusion for the semiconductor devices, thus eliminating alignment difficulty.

Additional objects and features of the invention will appear from the following description in which the preferred embodiment is set forth in detail in conjunction with the accompanying drawings.

DESCRIPTION OF THE PREFERRED EMBODIMENT

Figure 1:
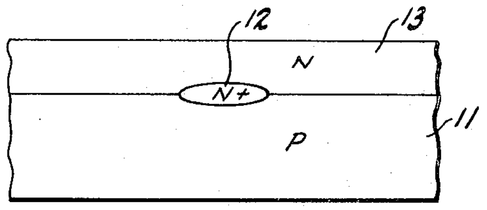
FIGS. 1 through 9 are cross-sectional views showing the steps utilized in constructing the semiconductor structure and assembly incorporating the present invention.

In performing the method for fabricating the semiconductor structure incorporating the present invention, a semiconductor body 11 of a suitable type such as silicon is provided having a surface orientation in the (100) crystal plane. The semiconductor body 11 is doped throughout with an impurity of one conductivity type, such as P-type. An epitaxial device is then formed by first growing an oxide layer (not shown) as a mask, opening windows (not shown) in the mask and diffusing the N+ impurity therethrough to provide N+ regions 12 which will serve as buried layers in a manner well known to those skilled in the art. An epitaxial layer 13 then can be grown on the doped semiconductor body 11 by suitable epitaxial techniques well known to those skilled in the art. The buried layers 12 grown into the layer 13 as it is deposited, partially by diffusion and partially by outgassing in a manner well known to those skilled in the art. At the time that the layer 13 is being grown, it can also be doped with an impurity and, as shown, can be doped with an impurity of opposite conductivity type, i.e., N-type as shown in FIG. 1. The N+ buried layer 12 is not essential to the structure and method of this invention, but is shown throughout the figures inasmuch as practical bipolar devices usually include an N+ buried layer for reasons well known to those skilled in the art.

Figure 2:
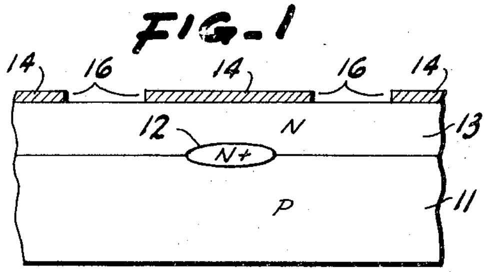
Figure 3:
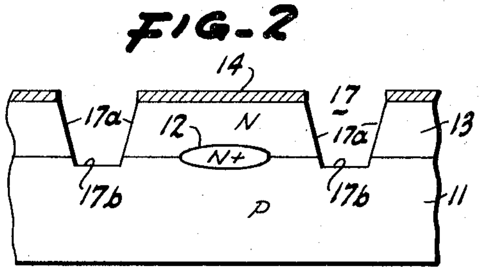

Thereafter, as shown in FIG. 2, an insulating layer 14 is formed on top of the epitaxial layer 13 and by suitable photolithographic techniques well known to those skilled in the art windows 16 are formed therein. The windows 16 can have any suitable geometry such as, for example, square or circular and are positioned in such a manner that there is sufficient space between the windows to fabricate the devices which are to be utilized in the integrated circuit which is to be formed.

After the windows 16 have been formed in the oxide layer 14, holes 17 are formed having sloping sides 17a and a flat bottom **17*b*. The holes 17 are etched to a depth preferably just below the epitaxial layer 13 into the semiconductor body 11 although the specific depth of the holes is governed by the geometry of the semiconductor structures as will be more fully discussed hereinafter. In accordance with this invention the holes 17 are etched using an anistotropic etch which, as is well known to those skilled in the art, selectively attacks the silicon wafer at differential rates along different crystal planes in order to provide pyramidal-shaped holes when square or rectangular geometry is utilized for the windows or cone-shaped holes when circular geometry is utilized for the windows. It should be appreciated that the size of the windows 16 should be large enough so that the holes 17 will be etched to the desired depth without coming to an apex. In accordance with a specific embodiment of this invention, when utilizing an epitaxial layer 13 of approximately 3 microns thickness it has been found suitable to form the windows 16 with a width of approximately 7 microns. The holes 17 formed by the anisotropic etch thus have sloping sidewalls 17*a* which are oriented in the (111) crystal plane and a flat bottom 17*b*** which is oriented in the (100) crystal plane.

Figure 4:
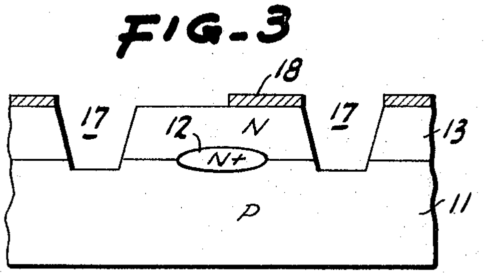

Subsequently, as shown in FIG. 4, a portion of the insulating material overlying the epitaxial layer between the holes 17 is removed, leaving a portion labeled 18 which will thereafter serve as a collector mask as more fully discussed hereinafter.

Figure 5:
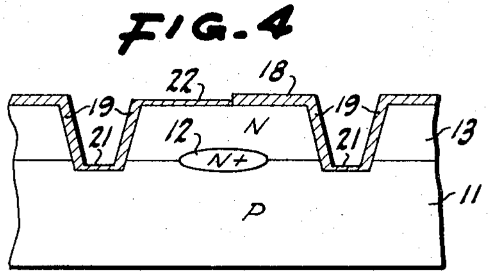

Then, as shown in FIG. 5 the structure of FIG. 4 is placed in an oxidizing atmosphere so that an insulating layer is formed on all the exposed surfaces including the sidewalls **17*a* of the isolation moat 17 and the bottom 17*b* thereof along with that portion of the epitaxial layer from which the insulating material was previously removed. In accordance with this invention, when the oxidation is carried out at a relatively low temperature there is a differential growth rate of the oxide between the (100) plane and the (111) plane. Thus, the insulating layer 19 which grows on the sidewalls 17*a* of the isolation moats 17 which are in the (111) plane (is substantially thicker than the insulating layer 21 formed on the bottoms 17*b* of the openings 17 and the insulating layer 22 formed on the top surface of the epitaxial layer 13 where the insulating material was previously removed. By relatively low temperatures, temperatures on the order of 900° C. to 920° C. is intended. At higher temperatures on the order of 1200° C. no appreciable difference in growth rates is observed but for temperatures on the order of 920° C. it is relatively easy to achieve a thickness differential between the insulating layers 19 and 21** on the order of 1000 A. units.

The structure shown in FIG. 5 is thereafter exposed to an etch which attacks the insulating material (i.e., silicon dioxide). Preferably a dilute etch is used so that etching proceeds rather slowly. The structure of FIG. 5 is exposed to the etch for a time just sufficient to entirely remove the insulating layers 21 and 22 while still leaving portions of the insulating layers 19 adhering to the sidewall **17*a* of the isolation moats or holes 17. A structure such as FIG. 6 is thus formed in which the isolation moats 17 have an insulating material covering the sidewalls 17*a* but all of the insulating material has been removed from their bottoms 17*b* and also from the top of the epitaxial layer 13 where the insulating coating 22** had been.

Figure 6:
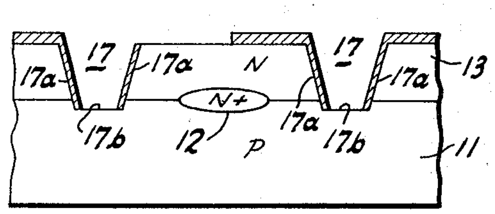

The next step is a diffusion operation in which the unmasked portions of the structure of FIG. 6 have impurities diffused therein which, according to the conductivity types being used for the portions of the semiconductor structure being described, are P+ diffusions. P+ isolation diffusions 23 are thus formed extending from the bottom of the isolation moats 17 and a P+ diffusion 24 is formed at the top surface of the epitaxial layer 15 which, for example, will serve as the transistor base for completed semiconductor transistors, all as shown as in FIG. 7. Thus, in accordance with this invention, the P+ isolation diffusions 23 are formed at the same time as the base diffusion 24. In accordance with this invention since the isolation diffusions 23 are formed at the bottom of the isolation moats 17 they can be the same depth as the base diffusion 24 so that they can be performed at the same time. This eliminates alignment difficulties between isolation and base diffusion. Further, since the sides **17*a* of the isolation moats 17 are masked against this diffusion, there is little lateral spreading of the diffusion from the sides of the isolation moats. The critical factor is the spacing between the P+ isolation diffusions 23 and the P+ base diffusion 24. The acceptable distance therebetween is primarily governed by space charge effects surrounding the diffusions. The necessary extent of this spacing determines the minimum depth to which the isolation moats must extend. As previously mentioned, where a 3 micron epitaxial layer 13 is utilized it has been found that the isolation moats 17 should extend down approximately completely through the epitaxial layer 13** or slightly beyond.

Figure 7:
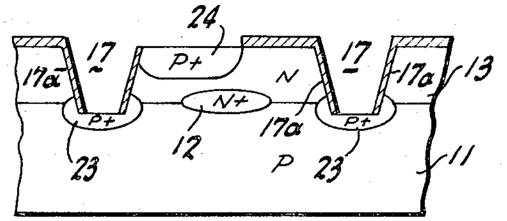
Figure 8:
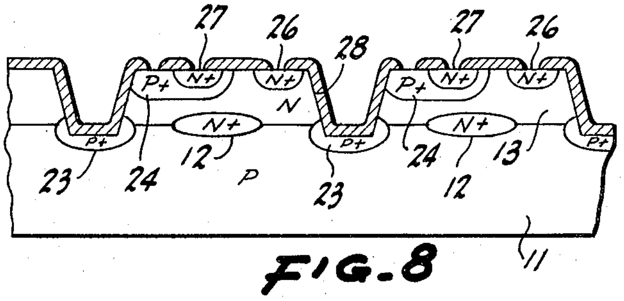

Thereafter, subsequent steps are performed on the structure shown in FIG. 7 for forming emitter and collector regions 26 and 27 by techniques well known in the art. An insulating layer 28 is then formed as shown in FIG. 8 leaving spaces for making contact to the base region 24, the emitter region 27 and the collector region 26.

Figure 9:
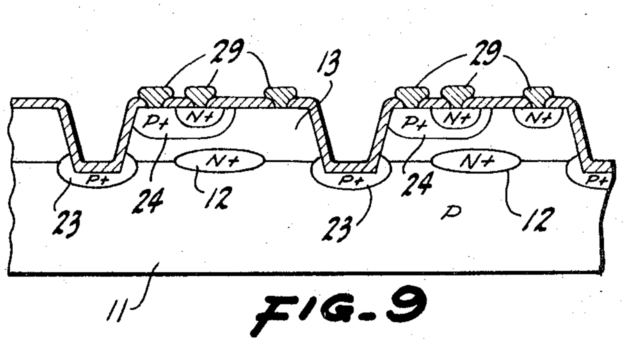

A portion of a completed structure is shown in FIG. 9 in which metallization generally indicated by reference numeral 29 has been added for interconnecting the various semiconductor devices which can be formed in a common substrate and for providing connection to external circuitry.

Thus, what has been described is an improved semiconductor structure and method for forming the same in which adjacent semiconductor devices can be spaced very closely (on the order of 7 microns, for example) while still maintaining adequate isolation therebetween. Further, in accordance with the method of this invention, the isolation regions can be formed at the same time as regions of the semiconductor body, thus obviating alignment difficulties.

What is claimed is:

1. A method for forming a semiconductor structure comprising the steps of epitaxially depositing on a surface of a silicon semiconductor substrate of one conductivity type and oriented along the (100) plane with a (100) orientation at said surface layer of silicon semiconductor material of an opposite conductivity type and having a top surface oriented along the (100) plane, forming an etch resistant mask on said top surface, forming by use of an anisotropic etch a plurality of isolation moats extending downwardly from the top surface to a depth sufficient to achieve isolation of portions of the epitaxial layer in conjunction with subsequently formed isolation regions and having inclined sidewalls oriented along one crystal plane of the silicon semiconductor material different from the (100) plane and having bottom walls generally planar and parallel to the top surface and oriented along the (100) crystal plane of the silicon semiconductor monocrystalline material, subjecting the sidewalls and bottom walls of the isolation moats to thermal oxidation at a relatively low temperature whereby oxide forms at a faster rate on the sidewalls than on the bottom walls of the isolation moats so that the resulting layer of oxide on the sidewalls is substantially thicker than the layer of oxide on the bottom walls, subjecting the isolation moats to an etchant for a time sufficient to remove all of the oxide from the bottom walls of the moats while still leaving oxide on the sidewalls of the moats, causing an impurity of one conductivity type to enter through the exposed bottom walls of the isolation moats and down into the substrate to form isolation regions having impurity concentrations greater than that of the substrate, and forming oxide on the bottom walls of the moats which adjoins the oxide on the sidewalls of the moats to provide isolated islands of semiconductor material.

2. A method in accordance with claim 1 wherein the isolation moats are formed to extend downwardly from the top surface a distance less than the thickness of the epitaxial layer of silicon semiconductor material and wherein the impurity is caused to enter through the exposed bottom walls of the isolation moats to a depth sufficient to extend into the semiconductor substrate.

3. A mehod in accordance with claim 1 wherein the isolation moats are formed to extend downwardly from the top surface a distance at least equal to the thickness of the epitaxial layer of semiconductor material and wherein the impurity is caused to enter through the exposed bottom walls of the isolation moats into the semiconductor substrate.

4. A method in accordance with claim 1 together with the step of forming semiconductor devices in the isolated islands.

5. A method in accordance with claim 4 wherein a portion of the etch resistant mask is removed from the top surface of the unetched portion of the epitaxial layer, and during thermal oxidation oxide is also deposited on the exposed top surface of the epitaxial layer of silicon semiconductor material and the newly formed thermal oxide on the top surface is removed at the same time the oxide is removed from the bottom walls of the isolation moats, and wherein an impurity is diffused into the top surface at the same time an impurity is diffused through the bottom walls of the isolation moats.

6. A method in accordance with claim 1 wherein the relatively low temperature at which thermal oxidation is performed is on the order of 920° C.

References Cited

UNITED STATES PATENTS

| | | | |
|---|---|---|---|
| 3,210,620 | 10/1965 | Lin | 317—234 |
| 3,237,062 | 2/1966 | Murphy | 317—234 |
| 3,243,323 | 3/1966 | Corrigan et al. | 148—175 |
| 3,254,277 | 5/1966 | Aarons | 317—235 |
| 3,386,865 | 6/1968 | Doo | 148—175 |
| 3,394,037 | 7/1968 | Robinson | 148—187 |
| 3,463,681 | 8/1969 | Winstel et al. | 29—578 X |
| 3,489,622 | 1/1970 | Barson et al. | 148—187 |
| 3,497,407 | 2/1970 | Esch et al. | 156—17 |
| 3,500,139 | 3/1970 | Frouin et al. | 317—235 |
| 3,659,160 | 4/1972 | Sloan et al. | 148—175 X |

OTHER REFERENCES

Bean et al.: "Influence of Crystal Orientation on Silicon Semiconductor Processing," Proc. IEEE, vol. 57, No. 9, September 1969, pp. 1469–1476.

Ligenza, J. R.: "Effect of Crystal Orientation . . . Steam," J. Phys. Chem., vol. 65, 1961 (November), pp. 2011–2014.

HYLAND BIZOT, Primary Examiner

W. G. SABA, Assistant Examiner

U.S. Cl. X.R.

29—578, 580; 117—201; 148—187; 156—17; 317—235 R